(12) United States Patent
Losehand

(10) Patent No.: US 7,247,926 B2
(45) Date of Patent: Jul. 24, 2007

(54) HIGH-FREQUENCY SWITCHING TRANSISTOR

(75) Inventor: Reinhard Losehand, Munich (DE)

(73) Assignee: Infineon Technologies AG, Munich (DE)

( * ) Notice: Subject to any disclaimer, the term of this patent is extended or adjusted under 35 U.S.C. 154(b) by 222 days.

(21) Appl. No.: 11/008,582

(22) Filed: Dec. 8, 2004

(65) Prior Publication Data

US 2005/0167784 A1 Aug. 4, 2005

Related U.S. Application Data

(60) Provisional application No. 60/528,026, filed on Dec. 9, 2003.

(51) Int. Cl.
*H01L 29/73* (2006.01)

(52) U.S. Cl. ............... 257/592; 257/582; 257/583; 257/557; 257/E21.181; 257/E29.187; 257/E29.171; 257/119; 257/132

(58) Field of Classification Search ............... 257/592, 257/557, E29.181, E29.187, E29.171, 119, 257/132

See application file for complete search history.

(56) References Cited

U.S. PATENT DOCUMENTS 2,806,983 A 9/1957 Hall 3,019,352 A * 1/1962 Wertwijn .................. 327/534
3,510,735 A * 5/1970 Potter ..................... 257/541
5,969,402 A 10/1999 Rynne
6,891,250 B1 * 5/2005 Sakamoto ................ 257/592

FOREIGN PATENT DOCUMENTS

GB 2 130 006 A 5/1984

* cited by examiner

*Primary Examiner*—Jerome Jackson
(74) *Attorney, Agent, or Firm*—Maginot, Moore & Beck

(57) ABSTRACT

A high-frequency switching transistor comprises a collector area, which has a first conductivity type, a first barrier area bordering on the collector area, which has a second conductivity type which differs from the first conductivity type, and a semiconductor area bordering on the first barrier area, which has a dopant concentration which is lower than a dopant concentration of the first barrier area. Further, the high-frequency switching transistor has a second barrier area bordering on the semiconductor area, which has a first conductivity type, as well as a base area bordering on the second barrier area, which has a second conductivity type. Additionally, the high-frequency switching transistor comprises a third barrier area bordering on the semiconductor area, which has the second conductivity type and a higher dopant concentration than the semiconductor area. Further, the high-frequency switching transistor has an emitter area bordering on the third barrier area, which has the first conductivity type. Thereby it is possible to provide a high-frequency switching transistor, which has a lower bias voltage, a higher switchable power as well as a shorter switching time.

23 Claims, 5 Drawing Sheets

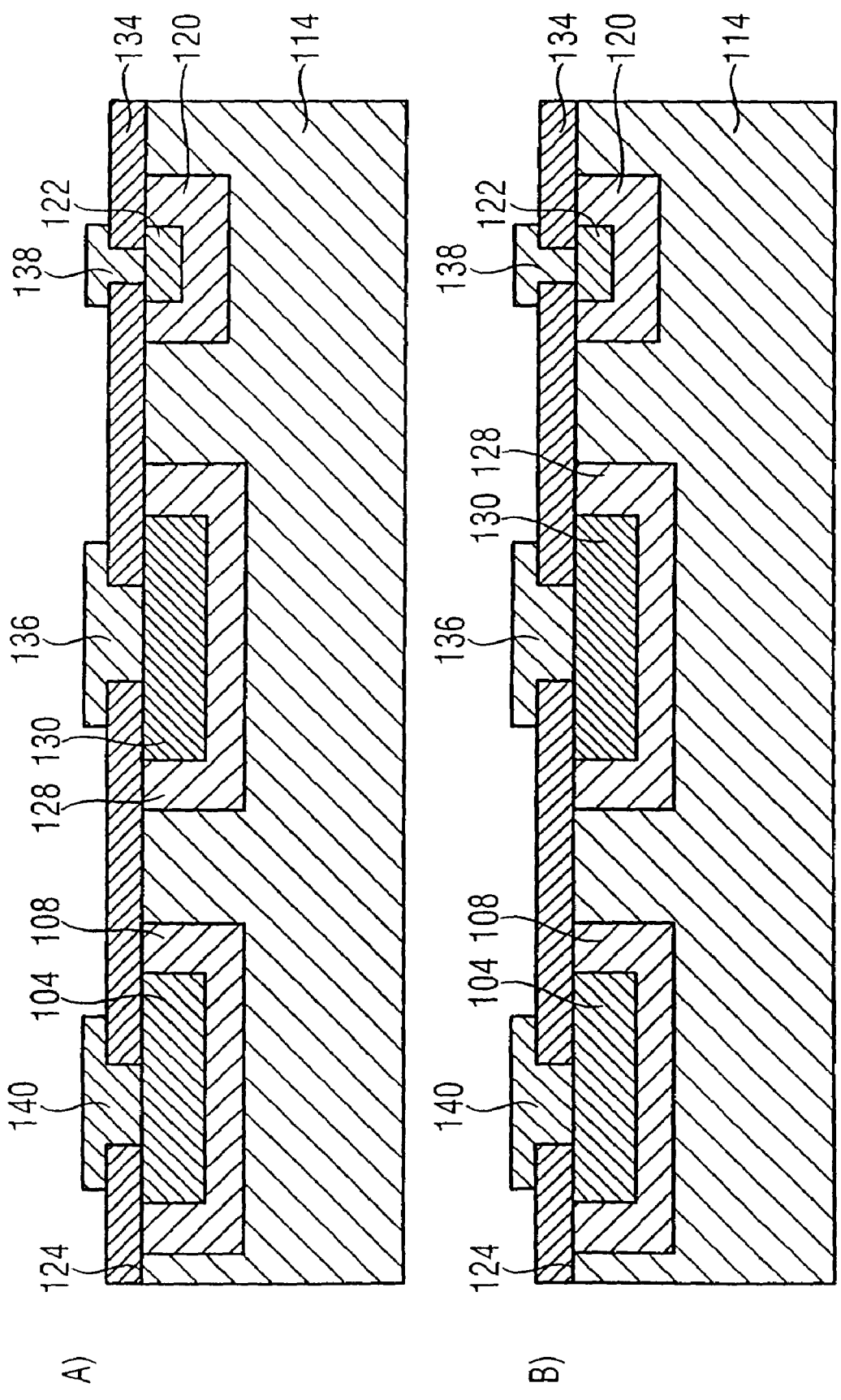

HIGH-FREQUENCY SWITCHING TRANSISTOR

This application claims the benefit of U.S. Provisional Patent Application Ser. No. 60/528,026, filed on Dec. 9, 2003, which is incorporated herein by reference.

BACKGROUND OF THE INVENTION

1. Field of the Invention

The present invention relates generally to a high-frequency switching transistor and particularly to a high-frequency transistor, which is known for a lower gating voltage than high-frequency transistors according to the prior art.

2. Description of Prior Art

It is the object of high-frequency switches to forward or block high-frequency signals. In the forward case, they should be characterized by an ohmic resistance, which is as small as possible, and in the blocking case, by a constant capacitance, which is as small as possible. They can be realized by different types of circuit elements. In the integrated circuit technology, high-frequency switches are often realized by using a silicon substrate. Thereby, generally, the two types of bipolar or MOS transistor can be formed. In the case of a silicon bipolar transistor, the forward case can be easily realized, if it is operated with a sufficiently large emitter base current in the triode area of the characteristic curve, far below the collector current saturation. At a correct transistor dimensioning, this control current can remain smaller than 1 mA. The blocking case causes more difficulties, since a base and substrate bias voltage, respectively, is required in the off-state, which is as high as the high-frequency amplitude to be blocked. In other words, it can be noted that a base emitter bias voltage has to be applied in the blocking direction with an amount of at least the amplitude of the high-frequency signal, so that the collector base diode is not controlled in the flow direction. Thereby, the switchable power is limited by the available bias voltage.

In battery-operated mobile radio systems, for example, this leads to the problem that a required bias voltage of about 20 volt is much higher than an operating voltage of the mobile radio system of, for example, 2.8 volt.

High-frequency switches for higher powers are realized outside the RF-ICs (RF-IC=radio frequency integrated circuits) in the form of PIN diodes or GaAs transistor switches, which can be operated with lower and no bias voltage, respectively. A disadvantage, however, is the higher cost which can occur due to the additional components.

Another disadvantage of PIN diodes as high-frequency switches is that PIN diodes require a partly higher switching time, which makes their usage in the high and highest frequency technique, respectively, problematic.

SUMMARY OF THE INVENTION

It is the object of the present invention to provide a high-frequency switch with a low bias voltage, a low switching time as well as switching possibility for high power.

In accordance with an aspect of the present invention a high-frequency switching transistor comprises a collector area having a first conductivity type, a first barrier area bordering on the collector area, having a second conductivity type, which differs from the first conductivity type, a semiconductor area bordering on the first barrier area, which has a dopant concentration which is smaller than a dopant concentration of the first barrier area or equal to zero, a second barrier area bordering on the semiconductor area, which has the first conductivity type, a base area bordering on the second area, which has the second conductivity type, a third barrier area bordering on the semiconductor area, which has the second conductivity type and a higher dopant concentration than the semiconductor area and an emitter area bordering on the third barrier area, which has the first conductivity type.

The present invention is based on the knowledge that by applying a predefined blocking voltage between the emitter area and the base area or the base area and the collector area, the semiconductor area can become almost free of charge carriers. Particularly the first and third barrier area contribute to this, which avoid a "flowing in" of charge carriers into the semiconductor area when the blocking voltage is applied. By such an application of the blocking voltage between the emitter and the base, a blocking potential can be built up in the semiconductor area. In order to be able to overcome this blocking potential, a voltage has to be used between the collector and the emitter, which is significantly higher than the switching voltage to be applied between emitter and base for blocking the switching transistor. By such a design, a high-frequency switch can be realized, which can be blocked by a low switching voltage (i.e. blocking voltage), wherein high-frequency signals applied between the emitter and the collector can be blocked with a high voltage amplitude. It is therefore an advantage that the high-frequency switching transistor merely requires a low bias voltage (i.e. switching or blocking voltage) for the switching operation, and thereby high powers are switchable between emitter and collector.

Further, it can be avoided by the second barrier area bordering on the base area, that charge carriers flow back into the semiconductor area between emitter and base despite the applied blocking voltage. Thereby, it is ensured that the blocking potential remains unchanged at applied blocking voltage between emitter and base, independent of a voltage applied between emitter and collector.

Further, the base area and the second barrier area bordering on the base area can be disposed in a predefined distance from the emitter area and the third barrier area bordering on the emitter area, so that by the space charge region being formed, the blocking potential is almost fully reduced already at small forward voltages. This has the further advantage that the switching voltage can be set in a defined way by a free choice of the distance and that the turn-on process in the inventive approach has a significantly lower turn-on delay than prior art approaches.

BRIEF DESCRIPTION OF THE DRAWINGS

A preferred embodiment of the present invention will be discussed below with reference to the accompanying drawings. They show:

FIG. 5a a further embodiment of an inventive high-to 5b frequency switching transistor in cross-sectional view;

DESCRIPTION OF PREFERRED EMBODIMENTS OF THE INVENTION

Figure 1:
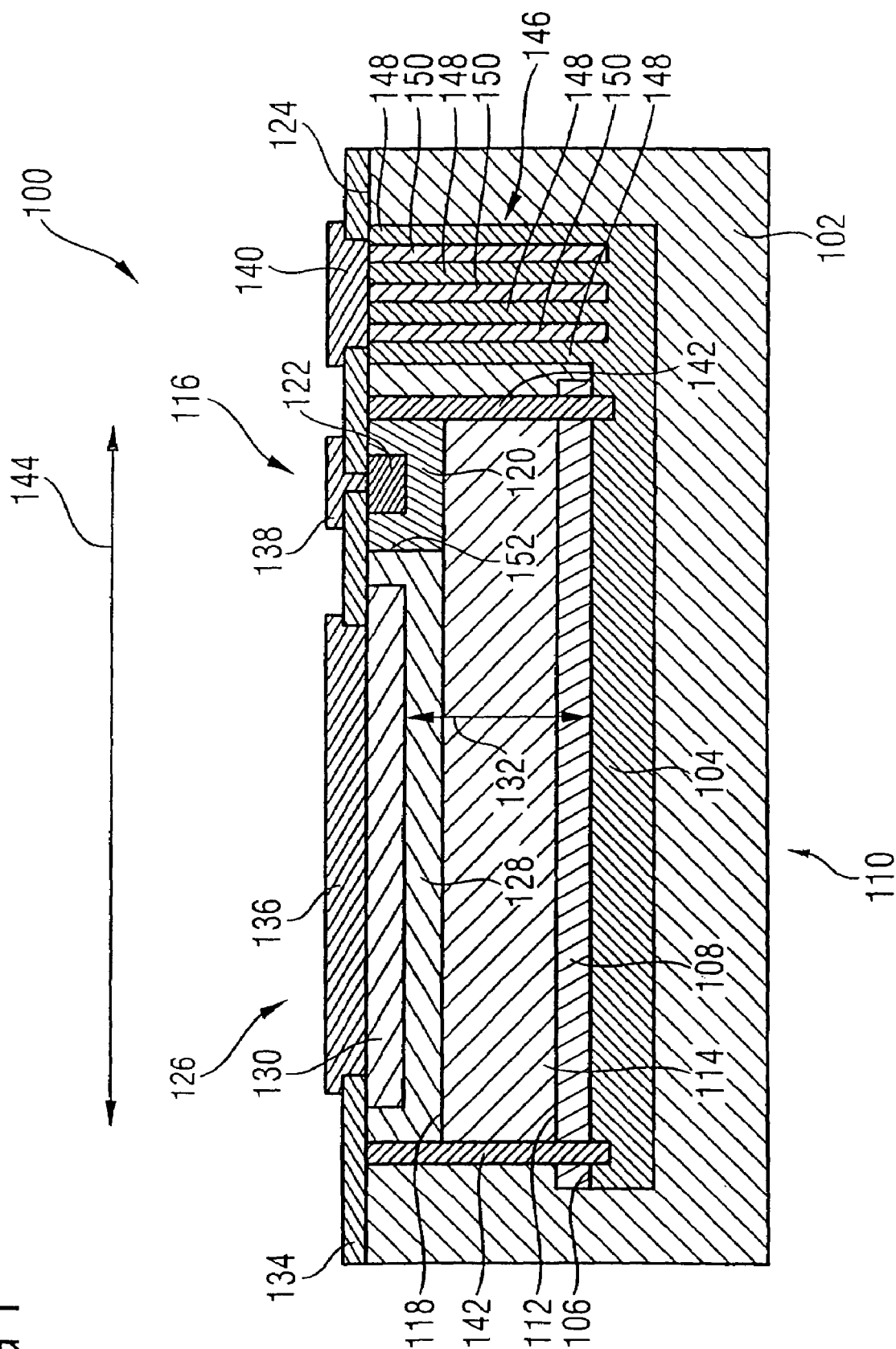
FIG. 1 an embodiment of an inventive high-frequency switching transistor in cross-sectional view.

FIG. 1 shows an embodiment of the inventive high-frequency switching transistor. The high-frequency switching transistor 100 comprises a semiisolating substrate 102, into which a collector area 104 is embedded. The collector area 104 has, for example, an n-doped semiconductor material with an n+dopant concentration which is high compared to the semi-isolating substrate 102 (i.e. it is a so-called buried layer n cathode). The dopant concentration of the semiconductor area in the collector area 104 preferably comprises more than $10^{19}$ dopant atoms per $cm^3$. Further, the collector area 104 forms the collector of the high-frequency switching transistor 100. Further, a first barrier area 108 is disposed on a surface 106 of the collector area 104, which preferably comprises a p-doped semiconductor material. In a central area 110 of the high-frequency switching transistor 100, a semiconductor area 114 is disposed on a surface 112 of the first barrier area 108, which preferably comprises a p-doped semiconductor material. However, the dopant concentration of the semiconductor area 114 is thereby lower than the dopant concentration of the first barrier area 108. Preferably, the dopant concentration of the first barrier area 108 is between $10^{16}$ and $10^{17}$ dopant atoms per $cm^3$, however, the dopant concentration of the first barrier area 108 can also lie within a range of values of $10^{15}$ to $10^{18}$ dopant atoms per $cm^3$. The dopant concentration of the semiconductor area, on the other hand, is preferably smaller than $10^{14}$ dopant atoms per $cm^3$.

Further, the first barrier area 108 has preferably a thickness between the surface 106 of the collector area 104 and the surface 112 of the first barrier area 108, which lies within a range of values between 0.2 μm and 1 μm. Alternatively, however, the thickness of the first barrier area can also lie within a range of values between 0.1 μm and 2 μm.

Further, a second barrier area 120 is disposed in a portion 116 of a surface 118 of the semiconductor area 114. The second barrier area 120 preferably comprises an n-doped semiconductor material. Further, a base area 122 is embedded in the second barrier area 120. With regard to the dopant concentration and the thickness of the second barrier area 120 between the surface 118 of the semiconductor area and the base area 122, the statements of the first barrier area 108 hold true analogously. Further, the base area 122 is embedded in the second barrier area 120, such that a flush termination with a second barrier area 120 results on the surface 124.

Further, a third barrier area 128 is disposed in a portion 126 of the surface 118 of the semiconductor area 114. The third barrier area 128 comprises again preferably a p-doped semiconductor material. An emitter area 130 is disposed in a third barrier area 128 such that a flush termination results between the third barrier area 128 and the emitter area 130 on the surface 124. With regard to the dopant concentration of the third barrier area 128, as well as the thickness of the third barrier area 128 between the surface 118 of the semiconductor area 114 and the emitter area 130, the statements with regard to the first barrier area 108 hold true analogously.

The thickness of the semiconductor area 114 between the surface 112 of the first barrier area 108 and the surface 118 of the semiconductor area 114 lies preferably within a range of values between 5 μm and 8 μm. Alternatively, the thickness of the semiconductor area 114 can also lie within a range of values between 4 μm and 10 μm. Therefrom, a distance 132 of 8 μm can result between the collector area 104 and the emitter area 130.

Further, an isolating cover layer 134 is disposed on the surface 124. The isolating cover layer 134 has an opening for contacting the emitter area 130 through an emitter contact structure 136, an opening for contacting the base area 122 with the assistance of a base contact structure 138 as well as an opening for contacting the collector area 104 via a collector contact structure 140. Further, the high-frequency switching transistor 100 has a boundary structure 142, which limits the semiconductor area 114 as well as the third barrier area 128 on the left side and the semiconductor area 114 as well as the second barrier area 120 on the right side. The boundary structure 142 preferably comprises an isolating material and terminates in a flush way with the second barrier area 120 and the third barrier area 128 on the surface 124. Further, the boundary structure 142 projects into the first barrier area 108 as well as the collector area 104. Thus, a lateral extension 144 of the semiconductor area 114, the second barrier area 120 as well as the third barrier area 128 is defined by the boundary structure 142. The lateral extension 144 lies preferably within a range of values between 20 μm and 200 μm. Further, the high-frequency switching transistor 100 can also be formed two-dimensionally, whereby the boundary structure defines a volume, which has substantially a square base, which is disposed in parallel to a main area of the first barrier area 108, and has a base area side edge, which is maximally the lateral extension 144. The base area would further be perpendicular to the drawing level of FIG. 1.

Further, outside the area with the lateral extension 144 defined by the boundary structure 142, a contacting structure 146 is disposed. The contacting structure 146 has conductive areas 148 and isolating areas 150. The conductive areas 148 of the contacting structure 146 enable further an electrically conductive connecting of the collector contact area 140 to the collector area 104. Thereby it is possible to contact the collector area 104 via the collector contacting area 140 conductively, wherein the collector contacting area 140 is disposed higher over the collector area 104 as for example a boundary area between the second barrier area 120 and the base area 122.

Further, the second barrier area 120 can be disposed in a predefined distance 152 from the third barrier area 128. In FIG. 1, the predefined distance 152 between the second barrier area 120 and the third barrier area 128 has a value of zero, the predefined distance 152, however, can be up to 20 μm.

Thus, FIG. 1 shows the cross section of a structure of an integrable npn bipolar transistor, which is optimized for circuit applications. A buried layer (collector area 104) with trench sinker (contacting structure 146) is used, by which the collector area 104 can be contacted from the surface 124 by using the collector contacting area 140. The high-frequency switching transistor 100 is further surrounded by a trench (boundary structure 142), which prevents a coupling to a possibly bordering (in FIG. 1 not shown) high-frequency switching transistors by minority carrier injection. An emitter base collector doping profile contains a low n- (or p-)doped, almost intrinsic base I zone (semiconductor area 114). A higher p-doping is introduced directly at the emitter area 130 and at the collector area 104, (first barrier area 108 as well as a third barrier area 128), which form barriers against electron emission from the respective bordering collector area 104 as well as the emitter area 130 into the semiconductor area 114. Thereby, the blocking ability of the high-frequency switching transistor 100 is effected. A base contact is formed in the intrinsic base area (i.e. in the semiconductor area 114), whereby the second barrier area 120 as well as the base area 122 embedded in the second barrier area 120 result. The base area 122, which comprises a p-doped semiconductor material is further surrounded by an n-doped zone (i.e. the second barrier area 120), which forms a barrier against hole emission.

Thus, according to the embodiment of the inventive high-frequency switching transistor illustrated in FIG. 1, an n-doped semiconductor material forms the first conductivity type, and a p-doped semiconductor material forms the second conductivity type. Thereby, the base area 122 obtains the property that it can receive holes at a negative voltage against the emitter or collector, but returns them at positive polarity only when reaching a threshold voltage. This threshold voltage depends on the formation of a space charge region between the emitter area 130 and the base area 122 (and between the third barrier area 128 and the second barrier area 120, respectively) (emitter injection threshold voltage). This space charge region is, among other things, dependent on the predetermined distance 152 between the second barrier area 120 and the third barrier area 128. Further, an injection threshold voltage between the base area 122 and the collector area 104 has to be considered, which is again formed by a space charge region between the first barrier area 108 and the second barrier area 120. Above that, a collector emission threshold voltage has to be considered, which is effected by a space charge region formation between the first barrier area 108 and the third barrier area 128. Thus, by choosing the respective distances between the first barrier area 108, the second barrier area 120 and the third barrier area 128 (i.e. by an appropriate structure of the high-frequency switching transistor 100 illustrated in FIG. 1), it can be achieved that the emitter injection threshold voltage is small (such as 2.5 volt), while the collector emission threshold voltage is high (such as 20 volt). Below the respective emission threshold voltages, the turn on procedure is delayed so much by forming space charge regions in the barrier areas that no remarkable current flows in flow direction at short-term controlling.

Further, the high-frequency switching transistor 100 can be built in a high-frequency circuit, which is not illustrated here. The high-frequency circuit can comprise a control circuit, which is formed to open or close the switch with the high-frequency switching transistor depending on a control signal, wherein the control means is formed to apply a negative switching voltage between the barrier area and the emitter area for closing the switch. Thereby, the switch can have a switch input (such as the collector area of the high-frequency switching transistor), which can be coupled to a high-frequency source. A voltage signal can be supplied from the high-frequency source, which has a high-frequency voltage amplitude, and wherein the switching voltage is smaller or equal to half the high-frequency voltage amplitude. Thus, in the blocking case, the transistor endures high-frequency voltage amplitudes of, for example, up to 20 volt between the collector area 104 and the emitter area 130, but can be switched to the on-state by the control circuit with a base emitter voltage of more than 2.5 volt.

In order to switch back to the off-state, the high-frequency switching transistor requires a negative base emitter voltage, which is so high that almost all charge carriers (such as electrons or holes) can be removed from the base area (i.e. particularly from the semiconductor area 114). The base emitter voltage depends particularly on the doping in the first barrier area 108, the second barrier area 120 as well as the third barrier area 128 and can be set such that it is about 2.5 volt. Thus, circuits (particularly a high-frequency switching transistor 100) can be realized, which can switch the high-frequency switching transistor on and off with supply voltages (switching voltages) of about slightly over 2.5 volt.

Still, the high-frequency amplitude of a high-frequency signal to be switched can be significantly higher than the switching voltage (such as 20 volt.).

Figure 2:
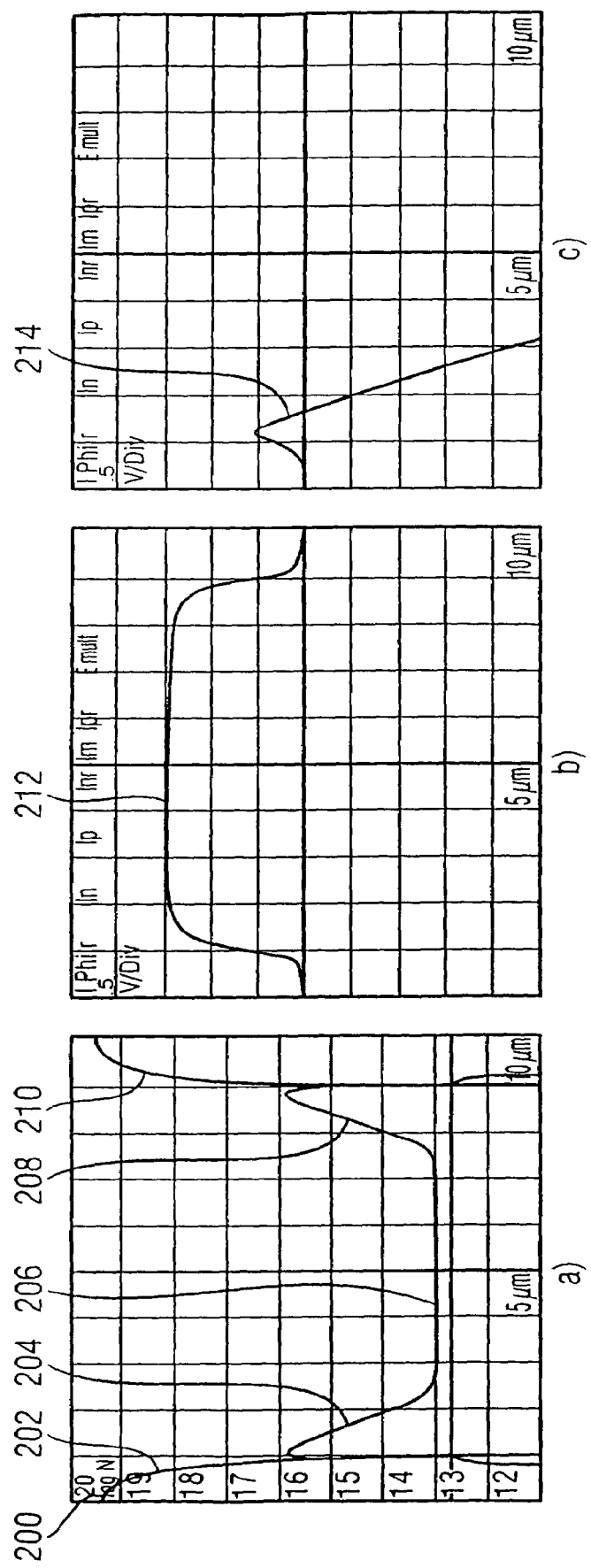
FIG. 2a an illustration of several simulation diagrams of to 2c an emitter area cross section of the embodiment of the inventive high-frequency switching transistor illustrated in FIG. 1.

FIG. 2a shows an exemplary dopant profile 200 of a cross-section of the high-frequency switching transistor structure illustrated in FIG. 1 in the emitter area. On the abscissa of the diagram illustrated in FIG. 2a, the position of the surface 124 of the high-frequency switching transistor 100 illustrated in FIG. 1 is indicated. On the ordinate of the diagram illustrated in FIG. 2a, the dopant concentration is indicated in logarithmical illustration. Thus, it can be seen from FIG. 2a, that a semiconductor area with a high (such as more than a $10^{19}$ dopant atoms per $cm^3$) dopant concentration is disposed in a left portion 202, by which the emitter area 130 illustrated in FIG. 1 is formed. A second portion 204 is bordering thereon, by which the third barrier area 128 illustrated in FIG. 1 is formed.

Further, from FIG. 2a the dopant concentration in the semiconductor area 114 which is lower in comparison to the third barrier area can be seen, which can be seen by a third portion 206 of the dopant profile 200 illustrated in FIG. 2a. The first barrier area 108 of the high-frequency switching transistor 100 illustrated in FIG. 1 has again a higher dopant concentration than the semiconductor area 114, which can be seen by a portion 208 of the illustrated dopant profile 200. Further, the collector area 104 can be seen in the dopant profile 200 in FIG. 2a by a portion 210.

If a sufficiently large negative base emitter voltage is applied to the base contact (such as −3 volt), almost the whole base area (such as the semiconductor area 114 illustrated in FIG. 1) becomes charge carrier free. The resulting potential in the semiconductor area 114 is now determined by the space charge in the p- and n-barrier areas.

FIG. 2b shows the potential curve in the blocking case for a specific collector emitter dopant profile, as it is illustrated in FIG. 2a, (i.e. when applying the blocking voltage between the base area and emitter area) without applying a voltage between the collector area 104 illustrated in FIG. 1 and the emitter area 130 (i.e. $V_{CE}$=0 volt). Thus, the two highly p-doped diffusion profiles (i.e. the first barrier area 108 as well as the third barrier area 128) generate in the potential curve each a barrier against electron emission into the base area (particularly in the semiconductor area 114), which has a blocking potential of 1.5 volt with regard to the emitter area 130 at a collector-emitter voltage of 0 volt. At high positive collector-emitter voltages, it is reduced on the left (i.e. at the emitter area 130), and in negative collector emitter voltages on the right (i.e. near the collector area 104).

In FIG. 2c, a collector emitter voltage of 15 volt (i.e. $V_{CE}$=15 V) is assumed, whereby it can be seen that the blocking potential is already almost reduced, but a rest potential of about 0.5 V still exists in the portion 214. Thereby, however, the blocking potential is still so effective that no remarkable current flows between the collector area 104 and the emitter area 130.

Figure 3:
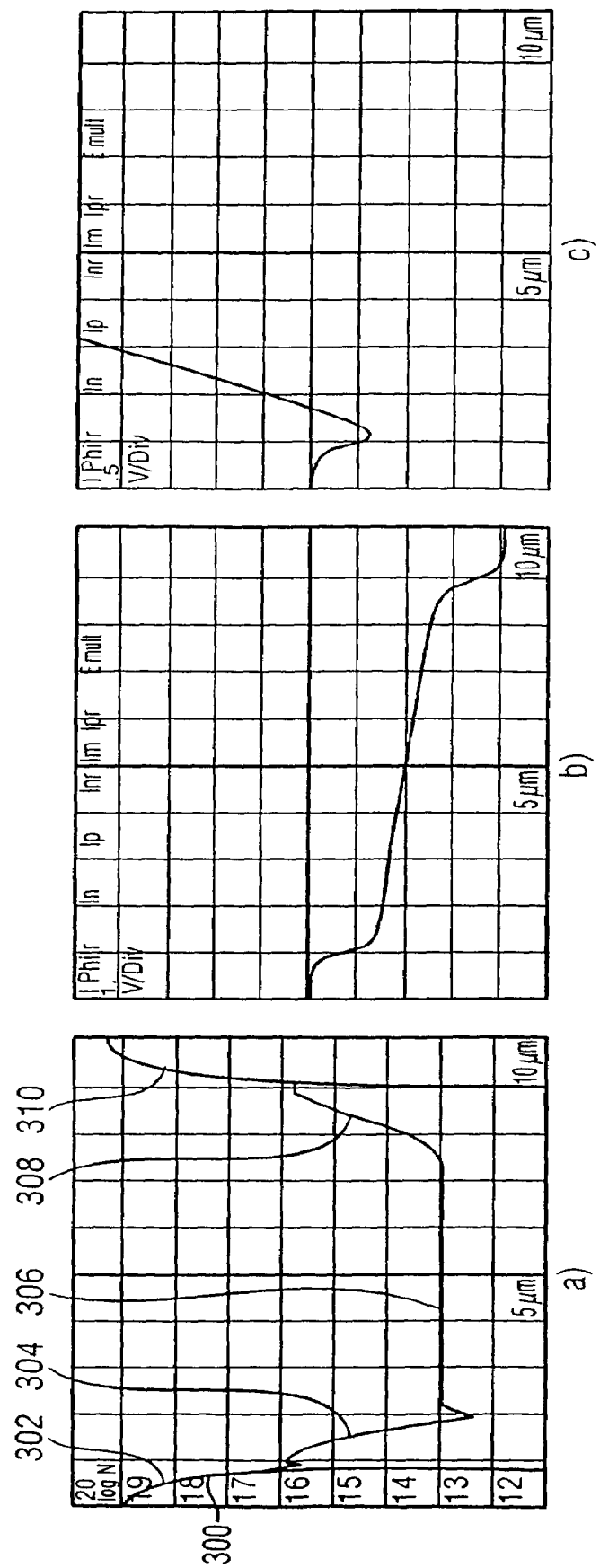
FIG. 3a an illustration of several simulation diagrams of to 3c a base contact area cross section of the high-frequency switching transistor illustrated in FIG. 1.

FIG. 3a shows an exemplary dopant profile 300 of a cross section of the high-frequency switching transistor 100 illustrated in FIG. 1 in the area of the base area 122. Thereby, again, the base area 122 can be seen by a portion 302 of the dopant profile 300, the second barrier area by a second portion 304, the semiconductor area 114 by a third portion 306, the first barrier area 108 by a fourth portion 308 as well as the collector area 104 by a fifth portion 310 of the dopant profile 300. When applying the negative base emitter voltage for blocking the high-frequency switching transistor, a potential curve as it is illustrated in FIG. 3b results in the base area. Thereby, again a negative voltage of −3 volt is applied between the base area 122 and the emitter area 130. At a voltage of 0 volt between the collector area 104 and the emitter area 130, thus, electrons can leave the base area (i.e. particularly the semiconductor area 114) to the right and holes to the left. This holds also true for all positive collector-emitter voltages. Thus, when applying a negative voltage at the collector area 104 (see FIG. 3c), a potential barrier remains in front of the base area 122, which prevents a reflow of the holes into the base (i.e. the second barrier area 120 as well as the semiconductor area 114).

Figure 4:
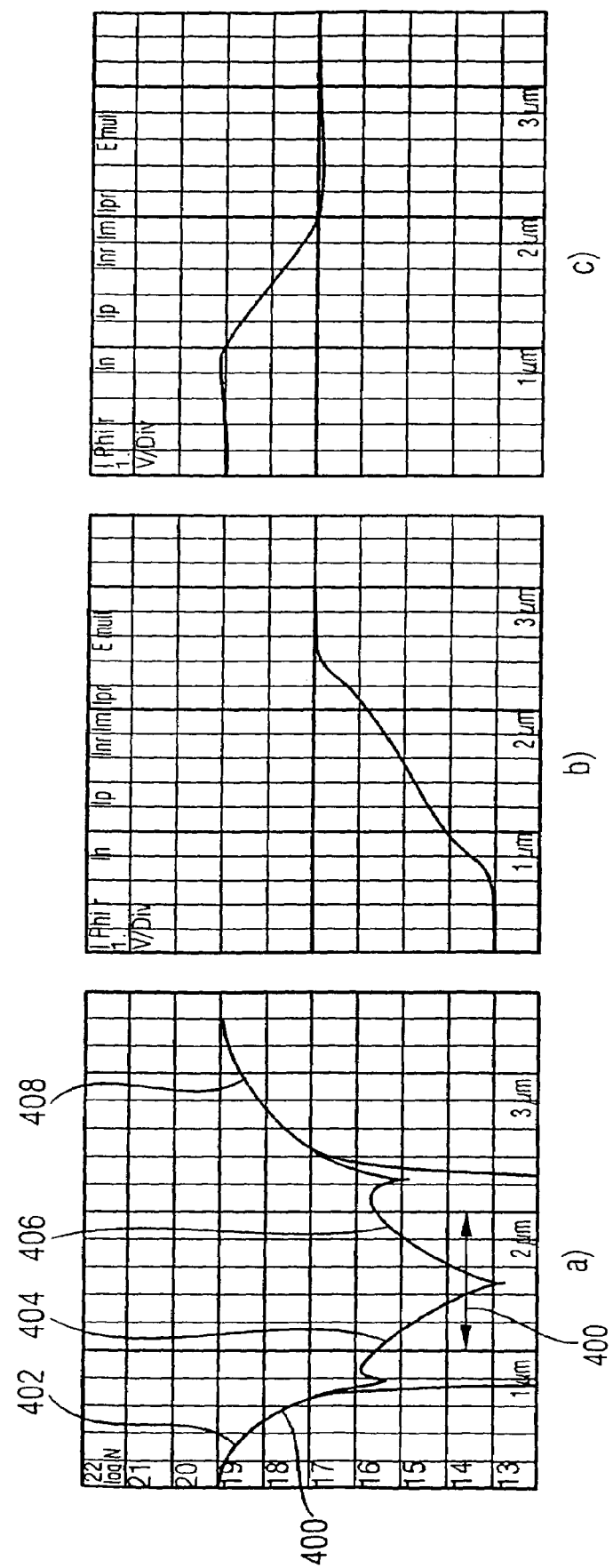
FIG. 4 an illustration of several simulation diagrams with regard to an area between emitter and base of the high-frequency switching transistor illustrated in FIG. 1.

FIG. 4 shows a diagram of an exemplary dopant profile 400 and two diagrams with potential curves between the emitter area 130 and the base area 122. In FIG. 4a, a curve of a dopant concentration is illustrated by the dopant profile 400. Thereby, a position of the emitter area 310 can be seen from the dopant profile 400 by a first portion 402, the position of the third barrier area 128 by a second portion 404, the position of the second area by a third portion 406 as well as a position of the base area 122 by a fourth portion 408 of the dopant profile 400. Thereby, a cathode-anode distance 410 is chosen with approximately 1.5 μm so short that a potential barrier (i.e. a blocking potential between the third barrier area 128 and the second barrier area 120) is reduced almost fully at small positive voltages between the base area 122 and the emitter area 130. Such a potential curve can be seen in FIG. 4c.

A potential curve with an applied blocking voltage of, for example, −3 volt between the base area and the emitter area is illustrated in FIG. 4b. By such a reduction of the potential barrier already at small positive voltages (such as +2.5 V) between the base area and the emitter area, a turn-on process with only a low turn-on delay of less than for example 1 ns results. Therefrom results a significant acceleration of the switching behavior compared to previous high-frequency switching transistors. A lower limit for the emitter-base distance results from the requirement that the breakdown voltage of the emitter-base diode has to be higher than the bias voltage in the off-state (i.e. the blocking voltage of about −3 volt). A minimal distance between the base area and the emitter area results then in about 0.1 μm. Thus, it can be seen that the embodiment of the inventive high-frequency switching transistor described herein enables a significant shrink of the transistor.

A limit of the shrink is achieved when a collector-base breakdown voltage becomes smaller than the collector emission threshold voltage. In the case of a 20 Volt transistor (i.e. a collector emission threshold voltage of 20 volt), this is for example the case at about 0.8 μm base collector distance. In this case, the emission barriers (i.e. the first barrier area, the second barrier area as well as the third barrier area) should be significantly flatter and doped higher than illustrated in FIG. 1. A negative consequence of a shrink is, however, that nonlinearities in the forward case increase and that therefore the control current has to increase about reversely proportional to the square of a shrink. In the boundary case, an increase of the control current of 0.1 mA to 10 mA results.

An increase of the control current is limited by the limit of trench etching and is thus currently limited to a maximum of 100 μm trench depth. Thereby, a significant lowering of the control current to up to 1 μA can be achieved. A negative consequence of increasing the control current is the deceleration of the switching procedure and an increase of the production cost.

As an alternative to the so far described npn bipolar transistor, a pnp transistor can also be realized. This pnp transistor is formed by a swapping the p- and n-doped areas, and also swapping the conductivity type of all doped areas. The function of the pnp transistor can be described in the same way, when respectively a role of the electrons and holes is swapped. Due to a higher mobility of the electrons, which are now the minority charge carriers, significant performance deteriorations result in the on-state. Thus, the pnp transistor requires higher currents to obtain the same resistance, wherein, however, stronger harmonics are generated at the same time. The off state of the pnp transistor suffers no significant restrictions.

Lateral transistors can also be realized with the described barrier structures. Therefore, a further embodiment of an npn high-frequency switching transistor is illustrated in FIG. 5a. In contrary to the vertical structure of the high-frequency switching transistor 100 illustrated in FIG. 1, which provides a vertically placed position of the collector area 104 under the emitter area 130, the collector area 104 as well as the first barrier area 108 bordering on the collector area 104 are disposed such that they mostly terminate in a flush way with the surface 124. Therefore, the base area 122, the emitter area 130 as well as the collector area 104 are disposed horizontally at about the same height, wherein in this case the semiconductor area 114 can be formed by the substrate 102. Further, the second barrier area 120 forms a hole barrier, while the first barrier area 108 as well as a third barrier area 128 form an electron barrier.

FIG. 5b shows a lateral pnp transistor, which is constructed analogous to the npn transistor illustrated in FIG. 5a. In difference to the transistor illustrated in FIG. 5a, however, the two conductivity types of the respective area are swapped. Thus, the first barrier area 108 as well as the third barrier area 128 form a hole barrier, while the second barrier area 120 forms an electron barrier.

The two variations illustrated in FIG. 5, however, are not suitable for the operation in the on-state, since they have no limited injection area. In discrete transistors, this causes already bad parameters. In integrated circuits, they effect couplings between blocked and switched-on transistors, which are most unwanted. Since lateral transistors, however, can be produced particularly easily and have good properties in the off-state, they can be used in applications which only use the off-state (such as in antenna lightning protection). The lightning protection consists of the fact that voltage of any polarity, whose amount is higher than the collector emitter threshold voltage makes the transistor conductive. Loads with high-frequency voltage amplitudes already at low bias voltage in blocking direction no longer have any effect.

In summary, it may be said that by inserting hole injection barriers into the base contact of npn bipolar transistors as well as an electron injection barrier in the collector it can be avoided that the collector base diode becomes conductive at flow polarization. In pnp bipolar transistors, hole emission barriers are swapped against electron emission barriers and vice versa.

Thus, an electron emission barrier results by a weakly doped p-layer bordering on a highly n-doped contact area and a hole emission barrier by a weakly n-doped layer bordering on a highly p-doped contact area. The $n^+pn^+$ dopant profile of a transistor is replaced by a $n^+pIpn^+$ dopant profile with an almost undoped I zone in the middle, the pp+ base contact is replaced by an Inp+ dopant profile.

REFERENCE NUMBER LIST

100 High-frequency switching transistor
102 Substrate
104 collector area
106 surface of the collector area
108 first barrier area
110 central area of the high-frequency switching transistor
112 surface of the barrier area 108
114 semiconductor area
116 portion of a surface of the semiconductor area 114
118 surface of the semiconductor area 114
120 second barrier area
122 base area
124 surface
126 further portion of the surface 118 of the semiconductor area 114
128 third barrier area
130 emitter area
132 distance between collector area 104 and emitter area 130
134 isolating cover layer
136 emitter contacting area
138 base contacting area
140 collector contacting area
142 boundary structure
144 lateral extension
146 contacting structure
148 conductive area of the contacting structure 146
150 isolating portion of the contacting structure 146
152 predefined distance between the second barrier area 120 and the third barrier area 128
200 dopant profile
202 first portion of the dopant profile 200
204 second portion of the dopant profile 200
206 third portion of the dopant profile 200
208 fourth portion of the dopant profile 200
210 fifth portion of the dopant profile 200
212 blocking potential
214 remaining blocking potential
300 dopant profile
302 first portion of the dopant profile 300
304 second portion of the dopant profile 300
306 third portion of the dopant profile 300
308 fourth portion of the dopant profile 300
310 fifth portion of the dopant profile 300
400 dopant profile
402 first portion of the dopant profile 400
404 second portion of the dopant profile 400
406 third portion of the dopant profile 400
408 fourth portion of the dopant profile 400
410 emitter base distance

What is claimed is:

1. A high-frequency switching transistor comprising:
   a collector area, having a first conductivity type;
   a first barrier area bordering on the collector area, the first barrier area having a second conductivity type which differs from the first conductivity type;
   a semiconductor area adjacent to the first barrier area, the semiconductor area having a dopant concentration which is at least one of the group consisting of lower than a dopant concentration of the first barrier area and equal to zero;
   a second barrier area adjacent to the semiconductor area, the second barrier area having the first conductivity type;
   a base area adjacent to the second barrier area, the base area having the second conductivity type;
   a third barrier area adjacent to the semiconductor area, the third barrier area having the second conductivity type and a higher dopant concentration than the semiconductor area; and
   an emitter area adjacent to the third barrier area, the emitter area having the first conductivity type.

2. The high-frequency switching transistor according to claim 1, wherein a the first conductivity type comprises n-doped and the second conductivity type comprises p-doped.

3. The high-frequency switching transistor according to claim 1, wherein the second barrier area borders on the third barrier area or is disposed in a predetermined distance to the third barrier area.

4. The high-frequency switching transistor according to claim 3, wherein the predefined distance has a value of at most 20 µm.

5. The high-frequency switching transistor according to claim 1, wherein at least one of the group consisting of the first barrier area, the second barrier area and the third barrier area have a dopant concentration substantially between $10^{15}$ and $10^{18}$ dopant atoms per $cm^3$.

6. The high-frequency switching transistor according to claim 5, wherein at least one of the group consisting of the first barrier area, the second barrier area and the third barrier area have a dopant concentration substantially between $10^{16}$ and $10^{17}$ dopant atoms per $cm^3$.

7. The high-frequency switching transistor according to claim 1, wherein the semiconductor area has a dopant concentration which is less than $10^{14}$ dopant atoms per $cm^3$.

8. The high-frequency switching transistor according to claim 1, wherein at least one of the group consisting of the collector area, the base area and the emitter area have a dopant concentration which is equal to or greater than $10^{19}$ dopant atoms per $cm^3$.

9. The high-frequency switching transistor according to claim 1, wherein at least one of the group consisting of the first barrier area, the second barrier area and the third barrier area has a thickness which lies within a range of values substantially between 0.1 µm and 2 µm.

10. The high-frequency switching transistor according to claim 9, wherein at least one of the group consisting of the first barrier area, the second barrier area and the third barrier area has a thickness which lies within a range of values substantially between 0.2 µm and 1 µm.

11. The high-frequency switching transistor according to claim 1, wherein the base area and the emitter area are formed in a substrate and are disposed at least in part laterally adjacent to each other.

12. The high-frequency switching transistor according to claim 1, wherein the collector area and the emitter area are formed in a substrate and are at least in part vertically displaced with respect to one another.

13. The high-frequency switching transistor according to claim 12, wherein the semiconductor area has a thickness which lies within a range of values substantially between 4 µm and 10 µm.

14. The high-frequency switching transistor according to claim 13, wherein the semiconductor area has a thickness which lies within a range of values substantially between 5 µm and 8 µm.

15. The high-frequency switching transistor according to claim 13, wherein a boundary structure is disposed on the side of the semiconductor area, the second barrier area and the third barrier area, through which a lateral extension of the semiconductor area, the second barrier area and the third barrier area is defined.

16. The high-frequency switching transistor according to claim 15, wherein the boundary structure includes an isolating material.

17. The high-frequency switching transistor according to claim 15, wherein the lateral extension of the semiconductor area, the second barrier area and the third barrier area lies within a range of values substantially between 20 µm and 200 µm.

18. The high-frequency switching transistor according to claim 15, wherein the semiconductor area has a square base area, wherein the base area is disposed in parallel to a main area of the first barrier area and has a base area side edge which is maximally the lateral extension.

19. The high-frequency switching transistor according to claim 12, wherein the collector area is configured to be contacted electrically conductively via a contact point of a contacting structure, wherein the contact structure is disposed higher over the collector area than a boundary area between the second barrier area and the base area.

20. The high-frequency switching transistor according to claim 19, wherein the contacting structure comprises at least a portion of an isolating material.

21. High-frequency switching transistor according to claim 12, wherein the collector area is disposed on a substrate which comprises a semi-isolating material.

22. A high-frequency circuit, comprising:
a switch with a high-frequency switching transistor, the high-frequency switching transistor including a collector area having a first conductivity type, a first barrier area bordering on the collector area, the first barrier area having a second conductivity type which differs from the first conductivity type, a semiconductor area adjacent to the first barrier area, the semiconductor area having a dopant concentration which is at least one of the group consisting of lower than a dopant concentration of the first barrier area and equal to zero, a second barrier area adjacent to the semiconductor area, the second barrier area having the first conductivity type, a base area adjacent to the second barrier area, the base area having the second conductivity type, a third barrier area adjacent to the semiconductor area, the third barrier area having the second conductivity type and a higher dopant concentration than the semiconductor area, and an emitter area adjacent to the third barrier area, the emitter area having the first conductivity type; and a control circuit, which is formed to open or close the switch depending on a control signal, wherein the control means is formed to apply a negative switching voltage between the base area and the emitter area for closing the switch.

23. The high-frequency circuit according to claim 22, wherein a circuit input can be coupled to a high-frequency source, wherein a voltage signal can be supplied from the high-frequency source, the voltage signal having a high-frequency voltage amplitude and wherein the switching voltage is smaller or equal to half the high-frequency voltage amplitude.

* * * * *